(12) United States Patent
Allpress

(10) Patent No.: US 7,454,684 B2
(45) Date of Patent: Nov. 18, 2008

(54) APPARATUS AND METHOD FOR TURBO DECODER TERMINATION

(75) Inventor: Stephen Alan Allpress, Bristol (GB)

(73) Assignee: Icera, Inc. (GB)

( * ) Notice: Subject to any disclaimer, the term of this patent is extended or adjusted under 35 U.S.C. 154(b) by 446 days.

(21) Appl. No.: 10/825,212

(22) Filed: Apr. 16, 2004

(65) Prior Publication Data
US 2004/0260995 A1 Dec. 23, 2004

(51) Int. Cl.
*H03M 13/29* (2006.01)
(52) U.S. Cl. .................................. 714/755; 714/758
(58) Field of Classification Search ................. 714/755, 714/780, 758
See application file for complete search history.

(56) References Cited

U.S. PATENT DOCUMENTS

| | | | |
|---|---|---|---|
| 6,182,261 B1 | 1/2001 | Haller et al. | |
| 6,292,918 B1 * | 9/2001 | Sindhushayana et al. | 714/755 |
| 6,378,106 B1 | 4/2002 | Allpress et al. | |
| 6,526,531 B1 * | 2/2003 | Wang | 714/704 |
| 6,904,555 B2 * | 6/2005 | Nagase et al. | 714/751 |

FOREIGN PATENT DOCUMENTS

EP          1 217 776 A2      6/2002

OTHER PUBLICATIONS

Al-Mohandes et al, "Iteration Reduction of Turbo Decoders using an Efficient Stopping/Cancellation Technique", ISCAS 2002, May 2002, pp. I-609-I-612.*

Shao, Rose Y., et al. "Two Simple Stopping Criteria for Turbo Decoding" IEEE Transactions on Communications, IEEE Inc. New York, US, vol. 47, No. 8, Aug. 1999, pp. 1117-1120.

Zhai, F. et al. "New Error Detection Techniques and Stopping Criteria for Turbo Decoding" Canadian Conference on Electrical and Computer Engineering, vol. 1, Mar. 7, 2000, pp. 58-62.

Chunlong Bai, et al. "Hardware Implementation of Log-MAP Turbo Decoder for W-CDMA Node B with CRC-Aided Early Stopping" IEEE 55th Vehicular Technology Conference VTC Spring 2002, vol. 2, May 6, 2002, pp. 1016-1019.

Chang, Y., et al. "Q-ary Turbo Codes with QAM Modulations" International Conference on Universal Personal Communications, IEEE, New York, US, vol. 2, Sep. 29, 1996, pp. 814-817.

Hagenauer Joachim., et al. "Iterative Decoding of Binary Block and Convolutional Codes." IEEE Transactions of Information Theory, vol. 42, No. 2, Mar. 1996, pp. 429-445.

Bai, Chunlong., et al. "Hardware Implementation of Log-MAP Turbo Decoder for W-CDMA Node B with CRC-Aided Early Stopping." VTC 2002, pp. 1016-1019.

(Continued)

*Primary Examiner*—Stephen M Baker
(74) *Attorney, Agent, or Firm*—McDermott Will & Emery

(57) ABSTRACT

An apparatus and method is disclosed for decoding a received sequence of symbols using a decoding process that comprises a plurality of decoder iterations. According to one embodiment of the invention, a method comprises determining whether a pre-determined decoder termination threshold metric has been met; only if the threshold metric has been met, determining whether a decoder termination test based on a cyclic redundancy check code has been passed; and, only if the cyclic redundancy check test has been passed, terminating the decoder iterations.

25 Claims, 5 Drawing Sheets

OTHER PUBLICATIONS

Shao, Rose Y., et al. "Two Simple Stopping Criteria for Turbo Decoding." IEEE Transactions on Communications, vol. 47, No. 8, Aug. 1999, pp. 1117-1120.

Shibutani, Akira., et al. "Complexity Reduction of Turbo Decoding." IEICE Trans. Commun, vol. E84-B, No. 9 Sep. 2001, pp. 2705-2709.

Berrou, Claude. "Near Optimum Error Correcting Coding and Decoding: Turbo-Codes." IEEE Transactions on Communications, vol. 44, No. 10, Oct. 1996, pp. 1261-1271.

European Search Report Issued in European Patent Application No. EP 04 727 039.2, dated Jun. 18, 2007.

* cited by examiner

APPARATUS AND METHOD FOR TURBO DECODER TERMINATION

TECHNICAL FIELD

This invention relates to error correcting coding and decoding, and in particular to termination of turbo decoder computation.

BACKGROUND

Turbo codes have found widespread application in systems that use error correcting coding and decoding. In many such systems, a Cyclic Redundancy Check (CRC) code is appended to a frame of data before it enters the turbo encoder, such as the parallel turbo encoder shown in FIG. 1. The encoding of the frame of data, together with the CRC, produces the systematic bits $x_k$, and the parity bits $z_k$ and $z_k'$. These bits are then punctured (deleted) to produce the required code rate. Transmission subjects the encoded signal to noise and channel perturbations. At the receiver, the turbo decoder recovers the original frame of data and the CRC.

The decoding process, such as that implemented by the turbo decoder for parallel concatenated codes shown in FIG. 2, is considerably more complex than the encoding process, and is responsible for a significant fraction of the total computation in the transceiver. The decoding process iterates a number of times (such as in iteration loop 220) before the output log-likelihood ratios are converted into hard-decisions 221. For each iteration, the error rate improves, as shown in FIG. 3, but with diminishing returns.

Conventional turbo decoding schemes tend to perform unnecessary iterations of the turbo decoder after decoding the frame correctly. This wastes time and computational resources.

To reduce computational resources and power consumption there has been some consideration of early-termination techniques. The most popular technique for early-termination of turbo decoders relies on the CRC code. In normal operation, after channel decoding, the frame of data passes through a CRC decoder to verify that the frame of data is correct. However, there is a possibility that the CRC will indicate that the frame of data is correct, when in fact the frame is incorrect. This will occur with a probability of approximately:

$$P_{fail} < \frac{P_{FER}}{2^{n-k}}$$

where $P_{FER}$ is the frame error rate, and n-k is the length of the CRC, which is carefully chosen to give an acceptable quality of perceived service. If such an error occurs, the incorrect data frame will be tagged as correct and passed to the higher protocol layers, with serious negative effects, particularly with compressed data sources. A scheme that uses the CRC for early termination of the turbo decoding process works by passing decoded frames of data to the CRC decoder on every turbo decoder iteration. Once the CRC code passes, the turbo decoder is terminated. Based on the error probability just discussed, the overall probability of mis-diagnosing an incorrect frame as correct in such a CRC termination scheme is:

$$P_{fail} \approx \frac{LP_{FER}}{2^{n-k}}$$

where L is the average number of turbo decoder iterations. Such a failure rate is unacceptable for many types of service.

Accordingly, embodiments of this invention seek to provide improved apparatus and methods of turbo decoder termination.

SUMMARY

According to one aspect of the present invention, there is provided a method for decoding a received sequence of symbols using a turbo decoding process that comprises a plurality of decoder iterations.

In one embodiment according to the invention, a method comprises determining whether a pre-determined decoder termination threshold metric has been met; only if the threshold metric has been met, determining whether a decoder termination test based on a cyclic redundancy check code has been passed; and, only if the cyclic redundancy check test has been passed, terminating the decoder iterations.

In a further related method embodiment, determining whether the threshold metric has been met may comprise determining whether a cross-entropy between a distribution of log-likelihood ratios for each decoder iteration is less than a predetermined cross-entropy threshold; or using a sign change ratio to monitor convergence of the decoding process; or using a hard-decision aided test; or using a sign difference ratio to monitor convergence of the decoding process; or using an average absolute log-likelihood ratio; or determining whether an absolute value of a smallest log-likelihood ratio is above a pre-determined absolute value threshold. A skilled person will appreciate that such a threshold comparison can be based on any suitable comparison criteria.

In a further related method embodiment, the method may further comprise receiving the sequence of symbols from a parallel turbo encoder, a serial turbo encoder, or a transmitter comprising an encoder and a modulator. The method may also comprise decoding symbols in a wireless cellular system, such as a system comprising a W-CDMA transmitter and a W-CDMA receiver.

According to another aspect of the invention, there is provided an apparatus for decoding a received sequence of symbols using a turbo decoding process that comprises a plurality of decoder iterations.

In one embodiment according to the invention, an apparatus comprises a threshold metric processor for determining whether a pre-determined decoder termination threshold metric has been met; a cyclic redundancy check processor for determining, only if the threshold metric processor determines that the threshold metric has been met, whether a decoder termination test based on a cyclic redundancy check code has been passed; and a decoder termination means for terminating the decoder iterations, only if the cyclic redundancy check test has been, passed.

In a further related apparatus embodiment, the threshold metric processor may comprise means for determining whether a cross-entropy between a distribution of log-likelihood ratios for each decoder iteration is less than a predetermined cross-entropy threshold; or means for using a sign change ratio to monitor convergence of the decoding process; or means for using a hard-decision aided test to monitor convergence of the decoding process; or means for using a sign difference ratio to monitor convergence of the decoding process; or means for using an average absolute log-likelihood ratio to determine whether the threshold metric has been met; or means for determining whether an absolute value of a smallest log-likelihood ratio is above a pre-determined absolute value threshold.

In a further related apparatus embodiment, the apparatus may further comprise means for receiving the sequence of symbols from a parallel turbo encoder, a serial turbo encoder, or a transmitter comprising an encoder and a modulator. The apparatus may also comprise a wireless cellular system, such as a system comprising a W-CDMA transmitter and a W-CDMA receiver.

In another embodiment according to the invention, there is provided a computer program product comprising program code means adapted to control any of the previously described methods.

Additional advantages and novel features of the invention will be set forth in part in the description which follows, and in part will become apparent to those skilled in the art upon examination of the following and the accompanying drawings; or may be learned by practice of the invention.

BRIEF DESCRIPTION OF THE DRAWINGS

For a better understanding of the present invention, and to show how the same may be carried into effect, reference will now be made, by way of example only, to the accompanying drawings, in which.

DETAILED DESCRIPTION

Figure 4:
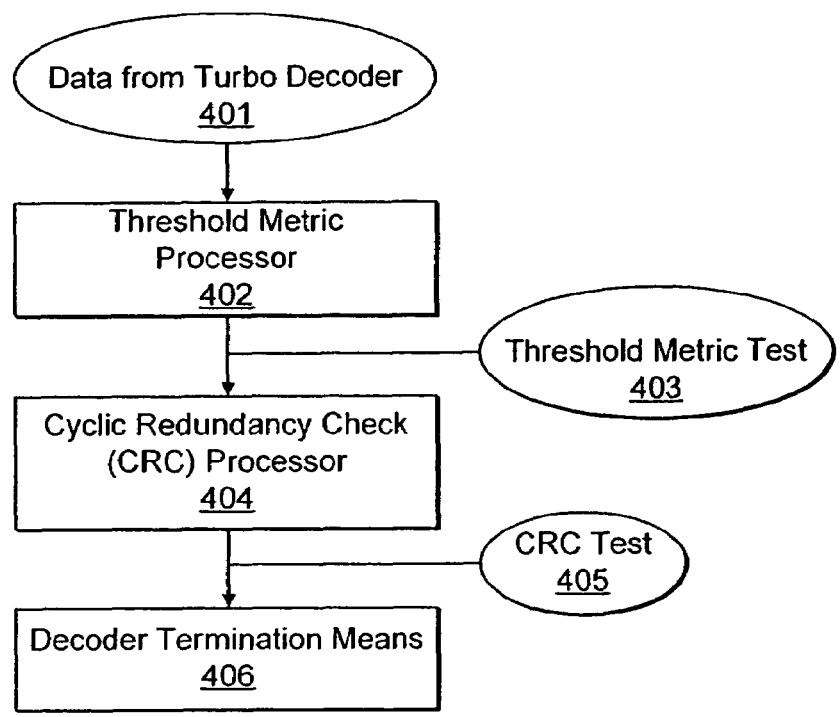
FIG. 4 is a block diagram of a turbo decoder termination apparatus, according to an embodiment of the invention.

FIG. 4 is a block diagram of a turbo decoder termination apparatus, according to an embodiment of the invention. In this embodiment, data 401 from iterations of a turbo decoder (which may include frame data, log-likelihood ratios, or other decoder data) are fed to a threshold metric processor 402, which performs a threshold metric test 403. The threshold metric test 403 determines whether decoding should terminate, based on whether a threshold metric has fallen above or below a particular threshold metric value. Only if the threshold metric processor 402 determines that decoding should terminate, a cyclic redundancy check (CRC) processor 404 performs a CRC test 405 to determine whether decoding should actually be terminated. Decoder termination means 406 terminates the decoder iterations only if the cyclic redundancy check test 405 passes.

In this way, the embodiment of FIG. 4 uses threshold metric processor 402 to reduce the number of times that the CRC is tested, as compared with a technique that uses only a CRC processor, since CRC processor 404 will only be used if threshold metric test 403 is passed. The CRC is thus not tested more than once for all but a tiny fraction of frames, so that the CRC failure rate $P_{fall}$ (discussed in the Background are section) is not increased appreciably. Furthermore, combining the threshold check with the CRC test eliminates premature termination of the turbo decoding process. The technique of the embodiment of FIG. 4 can also reduce the probability of a CRC failure in certain circumstances, since only data frames that have first passed the threshold test will be checked for CRC validity.

Figure 5:
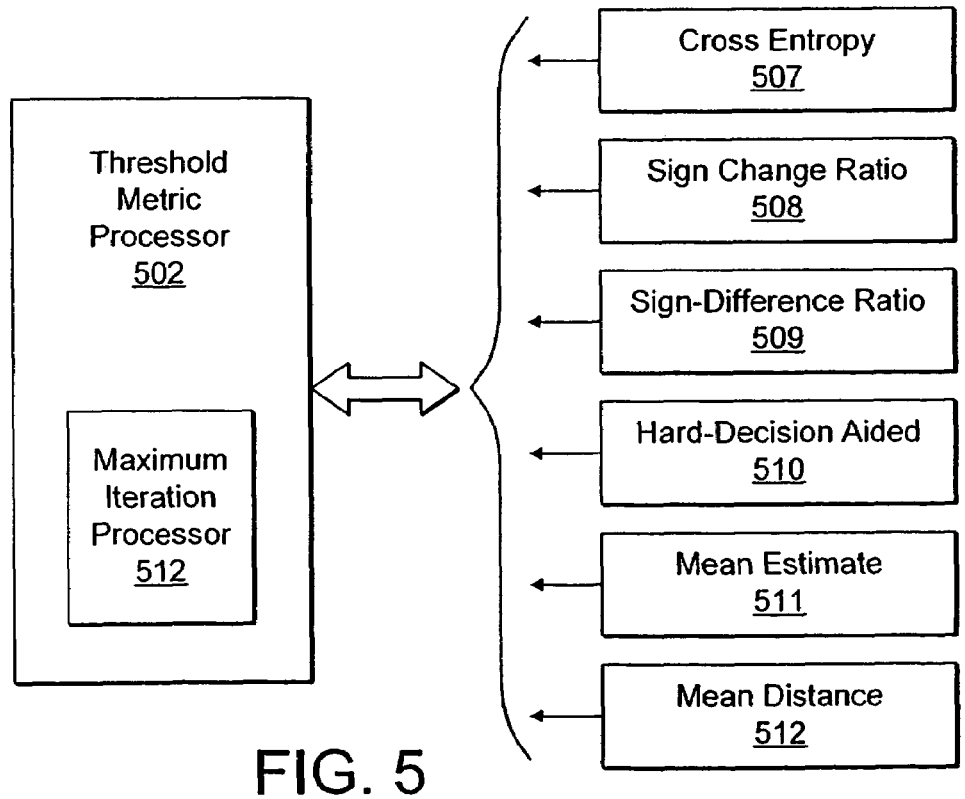
FIG. 5 shows a variety of possible techniques for use by a threshold metric processor, according to an embodiment of the invention.

FIG. 5 shows a variety of possible techniques 507-511 for use by a threshold metric processor 502, according to an embodiment of the invention. The threshold metric processor 502 may use one of these techniques 507-511, or a hybrid of more than one such technique, or another threshold metric technique, to perform a threshold metric test 403 in accordance with an embodiment of the invention In cross entropy test 507, the threshold metric processor 502 computes the cross-entropy $T(i)$ between the distributions of log-likelihood ratios at each iteration i. The cross-entropy $T(i)$ should diminish as decoding converges. Simulations show that $T(i)<(0.01$ to $0.0001)T(0)$ is a preferred threshold. Other suitable thresholds maybe determined based on various criteria or objectives as described in more detail hereinafter. The cross entropy test 507 may, for example, make use of principles illustrated in J. Hagenauer, E. Offer, and L. Papke, "Iterative Decoding of Binary Block and Convolutional Codes," IEEE Trans. Inform. Theory, vol. 42, pp. 429-445, March 1996, the disclosure of which is hereby incorporated herein by reference. Threshold metric processor 502 may also use a sign change ratio test 508, which monitors the convergence of the decoding algorithm by examining bow many bits have changed since the previous iteration; or may use a sign difference ratio test 509, which monitors the convergence of the decoding algorithm by examining the first derivative of the number of bits that have changed between iterations; or may use a hard-decision aided (HDA) test 510, which relies on comparing hard-decisions of information bits in successive decoder iterations. The sign change ratio test 508 and the hard-decision aided test 510 may, for example, make use of principles illustrated in R. Y. Shao, Shu Lin and Marc P. C. Fossorier, "Two Simple Stopping Criteria for Turbo Decoding," IEEE Transactions on Communications, vol. 47, no. 8, pp. 1117-1120, August 1999, the disclosure of which is hereby incorporated herein by reference. Alternatively (or in addition), in mean estimate test 511, the threshold metric processor 502 computes the average absolute log-likelihood ratio, and terminates decoding once a threshold value for the ratio is passed. The threshold metric processor 502 may also use mean distance test 512, in which decoding is terminated once the absolute value of the smallest log-likelihood ratio is above a particular value. The rationale behind this algorithm is that a frame error is most likely to occur for small absolute values of log-likelihood ratios. In effect, it is only necessary to consider tail events rather than the entire distribution of log-likelihoods. The sign difference ratio test 509, the mean estimate test 511, and the minimum distance test 512 may, for example, make use of principles illustrated in C. Bai, J. Jiang and P. Zhang, "Hardware Implementation of Log-MAP Turbo Decoder for W-CDMA Node B with CRC-Aided Early Stopping," IEEE VTC Conference May 2002, pp. 1016-1019, the disclosure of which is hereby incorporated herein by reference.

In accordance with an embodiment of the invention, the value of the threshold metric used by threshold metric processor 402 may be determined experimentally or through simulation. Setting the threshold metric too conservatively (i.e. setting the threshold value such that there is a larger number of decoder iterations before termination) results in too many iterations, while setting the threshold too aggressively (i.e. setting the threshold value such that there is a smaller number of decoder iterations before termination) results in an increased error rate. Preferably, in accordance with an embodiment of the invention that uses a threshold processor to reduce the number of times that a CRC test is performed, the threshold is set to a fairly aggressive value (i.e. one that reduces the number of decoder iterations as far as possible). The threshold may be dependent on a number of factors, such as the signal-to-noise ratio, iteration number, and frame size.

In accordance with another embodiment of the invention, threshold metric processor 402 may comprise a maximum iteration processor 512, as shown in FIG. 5. Maximum iteration processor 512 determines whether a frame of data passed the threshold test, but only after a pre-determined maximum number of decoder iterations; and identifies those frames as such for use in future processing. In this way the system is able to identify frames that are unlikely to be correct, even if the CRC test 405 is subsequently successful, so that the frames may be appropriately treated as potentially inaccurate in further processing steps.

Figure 6:
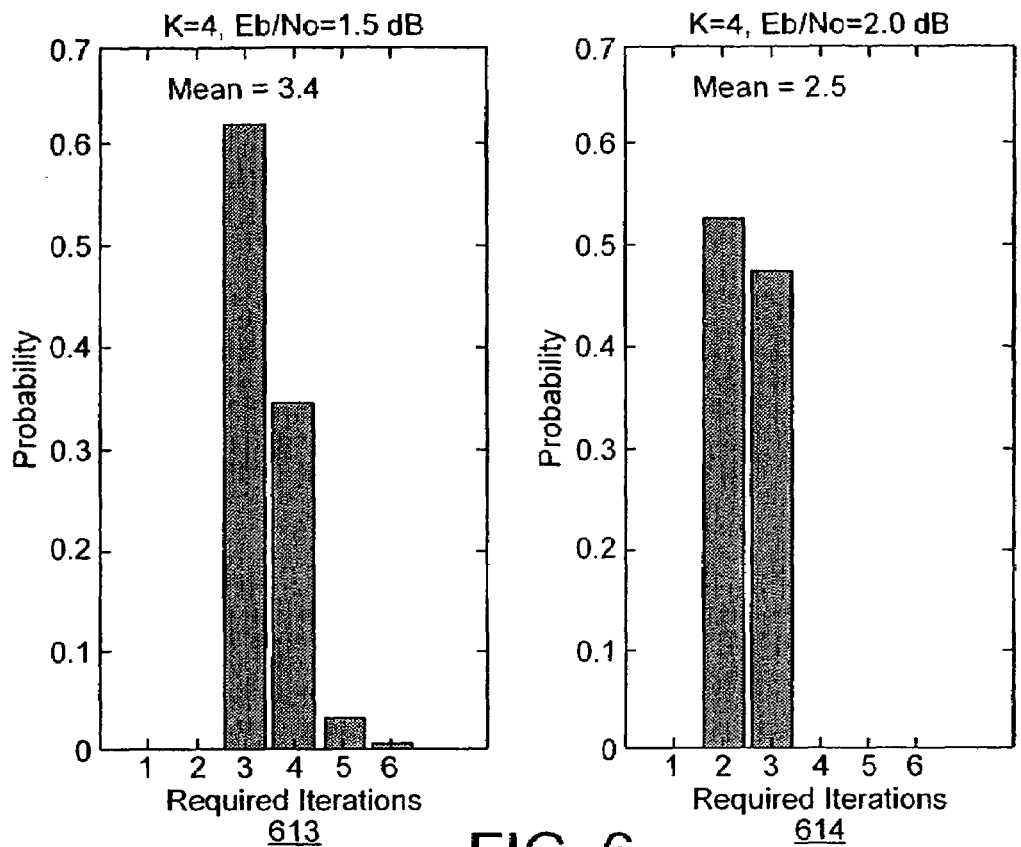
FIG. 6 shows graphs of the minimum number of turbo decoder iterations required for an embodiment according to the invention to achieve the same performance as a technique that uses a fixed number of iterations for all frames.

FIG. 6 shows the minimum number of turbo decoder iterations required for an embodiment according to the invention to achieve the same performance as a technique that uses a fixed number of iterations for all frames, based on simulations. In both graph 613, at an Eb/No ratio of 1.5 dB, and graph 614, at an Eb/No ratio of 2.0 dB, the average number of required decoder iterations is reduced, for achieving the same performance as a technique that uses a fixed number of iterations (here, a fixed number of six iterations). More generally, an algorithm according to the invention has the same power efficiency as a pure CRC-based technique, but does not increase the CRC failure rate, or overall error rate. In simulations, an embodiment according to the invention has been shown to give a power saving of 40 to 60%, depending upon frame length and signal-to-noise ratio.

Figure 7A:
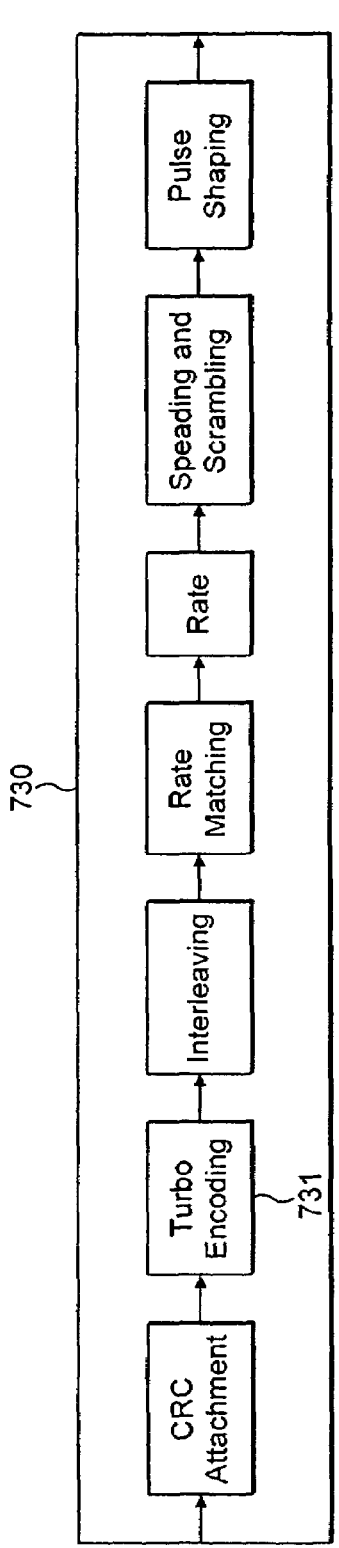
FIGS. 7A and 7B show a W-CDMA transmitter and receiver to which an embodiment according to the invention may be applied.
Figure 7B:
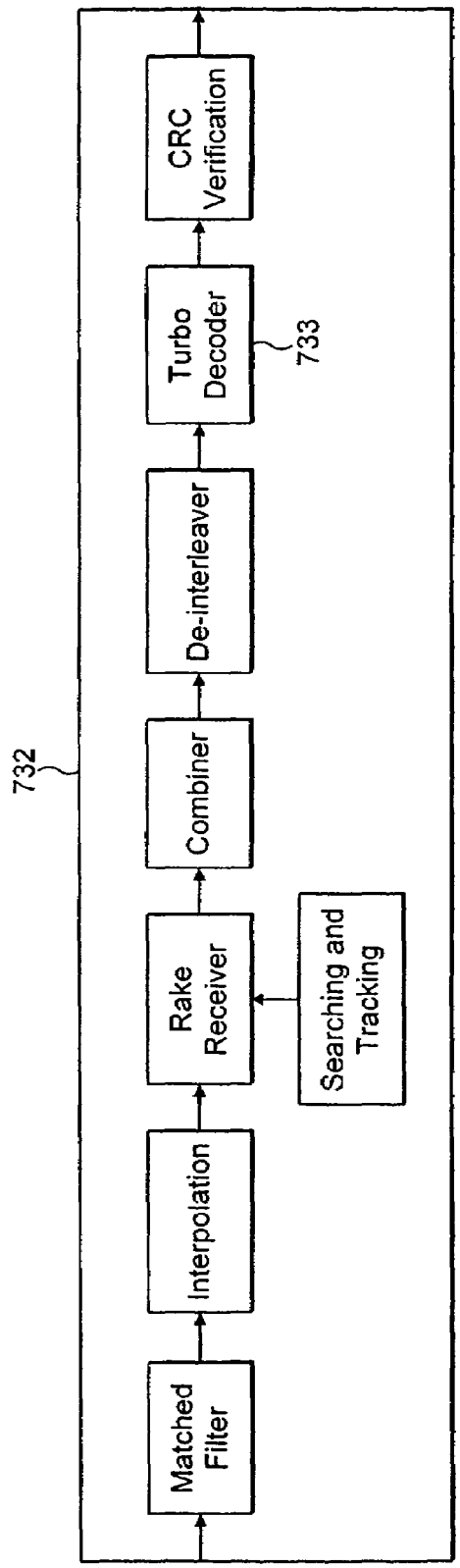

There are many envisaged applications and in fact embodiments of the invention may be used in any scenario in which turbo codes are employed in error correcting and decoding schemes. By way of example, one such application is found in third-generation wireless cellular systems. FIGS. 7A and 7B show an example of a W-CDMA system in which a turbo encoder and decoder may implement a technique of an embodiment according to the invention. The W-CDMA transmitter 730 of FIG. 7A includes a turbo encoder 731 and communicates with the W-CDMA receiver 732 of FIG. 7B. Receiver 732 includes a turbo decoder 733, which implements a decoder termination technique according to any of the embodiments described herein.

Figure 1:
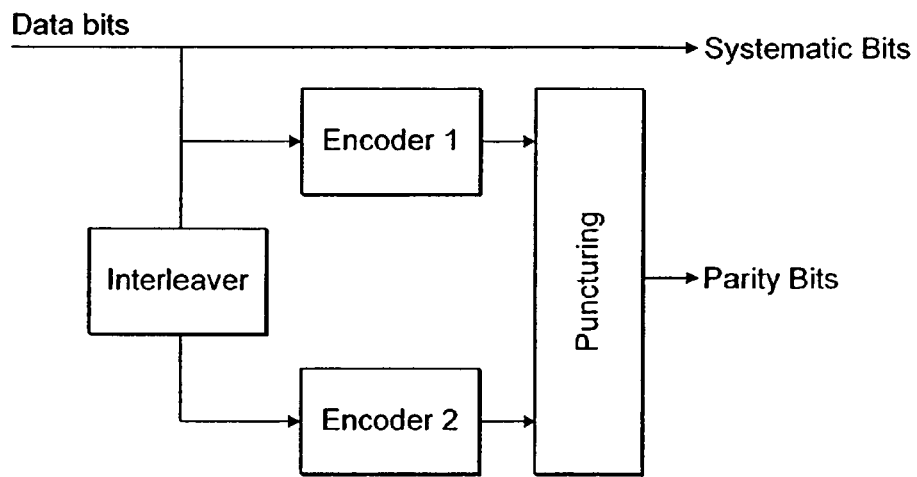
FIG. 1 shows a parallel turbo encoder system, according to the prior art.
Figure 3:
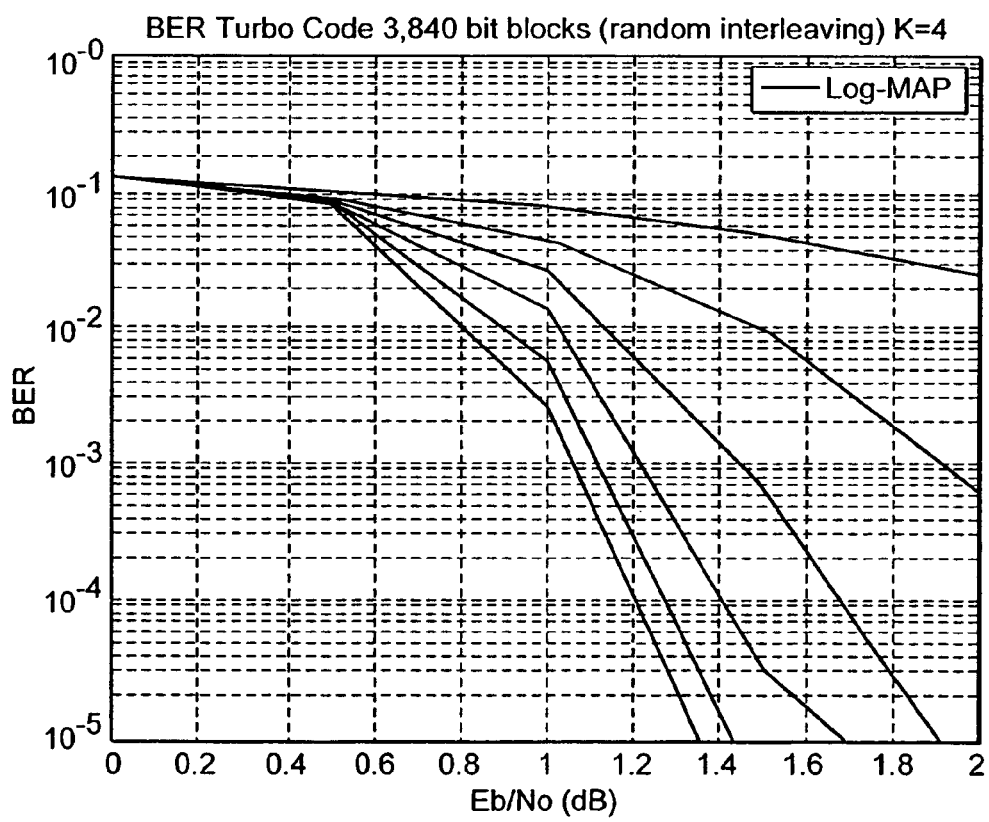
FIG. 3 shows typical turbo decoder performance, according to the prior art.
Figure 2:
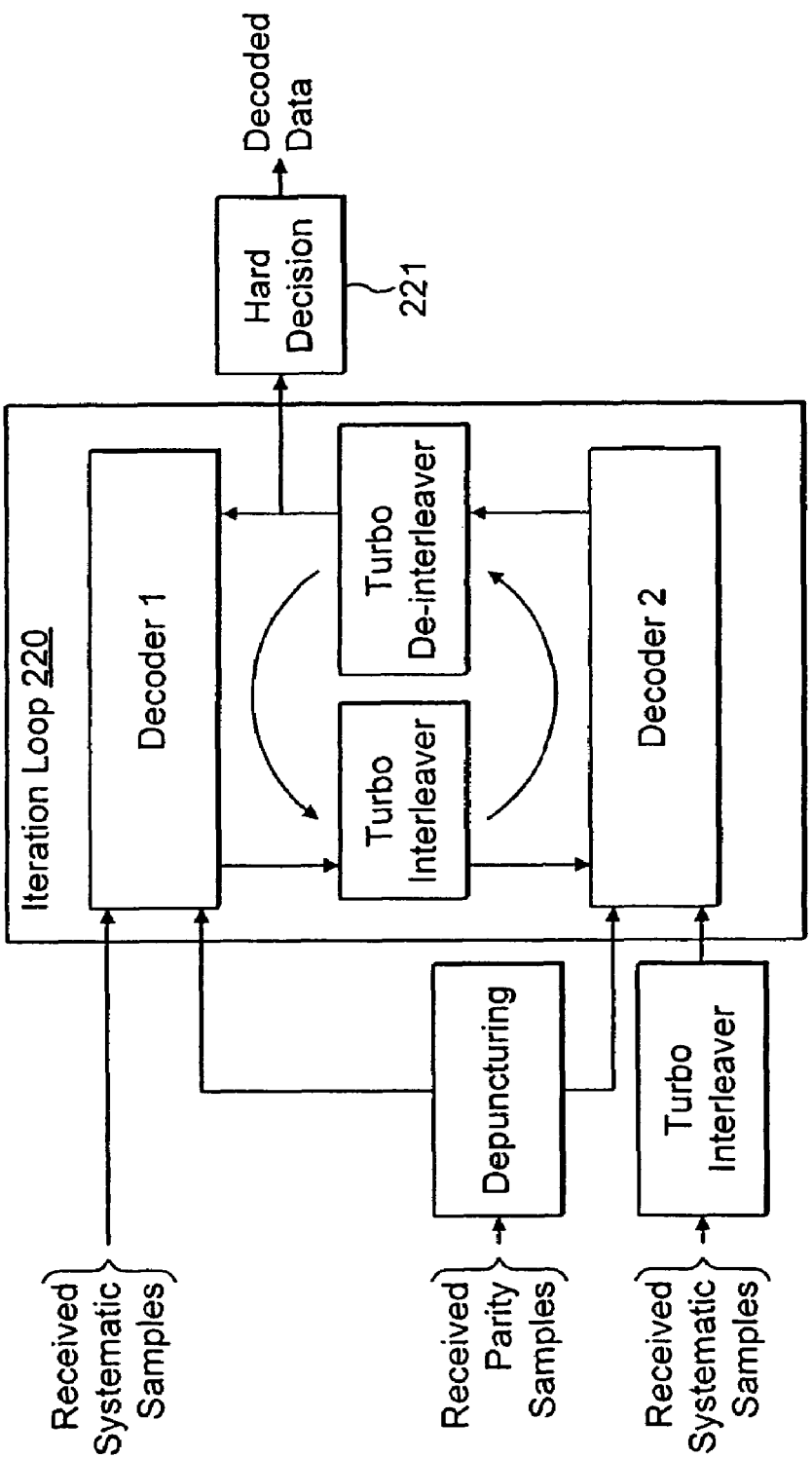
FIG. 2 shows a turbo decoder system, according to the prior art.
Figure 8:
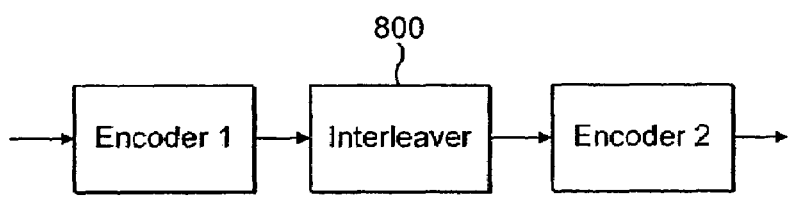
FIG. 8 shows a serial concatenated turbo code encoder with which an embodiment according to the invention may be used.
Figure 9:
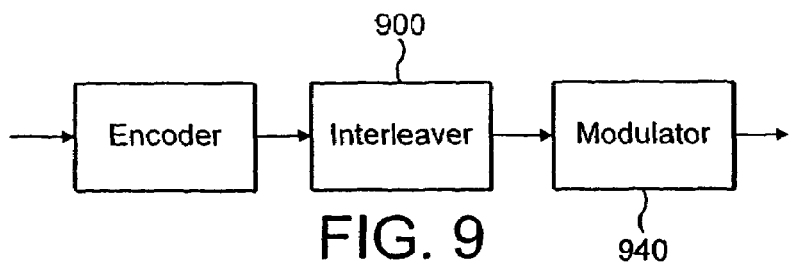
FIG. 9 shows a transmitter structure with which an embodiment according to the invention may be used.

In addition, it should be understood that embodiments described herein may be used with a variety of different possible encoder and decoder systems. For example, a turbo decoder in accordance with a n embodiment of the invention may be used with a parallel turbo encoder similar to that of FIG. 1. Alternatively, in accordance with an embodiment of the invention, a turbo decoder may be used with a serial concatenated turbo code encoder, such as serial encoder 800 of FIG. 8, as long as a CRC code (or some other method for verifying the frame's validity) is contained in the frame structure. Also, in accordance with an embodiment of the invention, a turbo decoder may be used in a receiver corresponding to a transmitter structure such as transmitter 900 of FIG. 9, as long as a CRC code (or some other method for verifying the frame's validity) is contained in the frame structure and the modulator 940 is not a memoryless process. It should also be understood that an encoder 950, used in transmitting to a decoder according to the invention, need not be a turbo encoder, but may be any encoding or modulating process with memory.

A skilled reader will appreciate that, while the foregoing has described what is considered to be the best mode and where appropriate other modes of performing the invention, the invention should not be limited to specific apparatus configurations or method steps disclosed in this description of the preferred embodiment. Those skilled in the art will also recognise that the invention has a broad range of applications, and that the embodiments admit of a wide range of modifications without departing from the inventive concepts.

What is claimed is:

1. A method for decoding a received sequence of symbols of a frame using a turbo decoding process that comprises a plurality of decoder iterations, the method comprising:
   determining whether a pre-determined decoder termination threshold metric has been met;
   if the threshold metric has been met but only after a pre-determined number of decoder iterations marking the frame as potentially inaccurate for further processing and passing the frame for cyclic redundancy check testing, or if the threshold metric has been met before the pre-determined number of decoder iterations passing the frame unmarked for cyclic redundancy check testing;
   only if the threshold metric has been met, determining whether a decoder termination test based on a cyclic redundancy check code has been passed; and
   only if the cyclic redundancy check test has been passed, terminating the decoder iterations.

2. A method according to claim 1, wherein determining whether the threshold metric has been met comprises determining whether a cross-entropy between a distribution of log-likelihood ratios for each decoder iteration is less than a pre-determined cross-entropy threshold.

3. A method according to claim 1, wherein determining whether the threshold metric has been met comprises using a sign change ratio to monitor convergence of the decoding process.

4. A method according to claim 1, wherein determining whether the threshold metric has been met comprises using a sign difference ratio to monitor convergence of the decoding process.

5. A method according to claim 1, wherein determining whether the threshold metric has been met comprises using a hard-decision aided test.

6. A method according to claim 1, wherein determining whether the threshold metric has been met comprises using an average absolute log-likelihood ratio.

7. A method according to claim 1, wherein determining whether the threshold metric has been met comprises determining whether an absolute value of a smallest log-likelihood ratio is above a pre-determined absolute value threshold.

8. A method according to claim 1, further comprising receiving the sequence of symbols from a parallel turbo encoder.

9. A method according to claim 1, further comprising receiving the sequence of symbols from a serial turbo encoder.

10. A method according to claim 1, further comprising receiving the sequence of symbols from a transmitter comprising an encoder and a modulator.

11. A computer program product provided on a computer-readable medium and comprising program code means adapted to perform the method of claim 1.

12. A method according to claim 1, wherein the method comprises decoding symbols in a wireless cellular system.

13. A method according to claim 12, wherein the wireless cellular system comprises a W-CDMA transmitter and a W-CDMA receiver.

14. An apparatus for decoding a received sequence of symbols of a frame using a turbo decoding process that comprises a plurality of decoder iterations, the apparatus comprising:
- a threshold metric processor for determining whether a pre-determined decoder termination threshold metric has been met;
- a maximum iteration processor for if the threshold metric has been met but only after a pre-determined number of decoder iterations marking the frame as potentially inaccurate for further processing and for passing the frame for cyclic redundancy check testing at a cyclic redundancy check processor, or if the threshold metric has been met before the pre-determined number of decoder iterations for passing the frame unmarked for cyclic redundancy check testing at the cyclic redundancy check processor;
- a cyclic redundancy check processor for determining, only if the threshold metric processor determines that the threshold metric has been met, whether a decoder termination test based on a cyclic redundancy check code has been passed; and
- a decoder termination means for terminating the decoder iterations, only if the cyclic redundancy check test has been passed.

15. An apparatus according to claim 14, wherein the threshold metric processor comprises means for determining whether a cross-entropy between a distribution of log-likelihood ratios for each decoder iteration is less than a pre-determined cross-entropy threshold.

16. An apparatus according to claim 14, wherein the threshold metric processor comprises means for using a sign change ratio to monitor convergence of the decoding process.

17. An apparatus according to claim 14, wherein the threshold metric processor comprises means for using a sign difference ratio to monitor convergence of the decoding process.

18. An apparatus according to claim 14, wherein the threshold metric processor comprises means for using a hard-decision aided test to monitor convergence of the decoding process.

19. An apparatus according to claim 14, wherein the threshold metric processor comprises means for using an average absolute log-likelihood ratio to determine whether the threshold metric has been met.

20. An apparatus according to claim 14, wherein the threshold metric processor comprises means for determining whether an absolute value of a smallest log-likelihood ratio is above a pre-determined absolute value threshold.

21. An apparatus according to claim 14, further comprising means for receiving the sequence of symbols from a parallel turbo encoder.

22. An apparatus according to claim 14, further comprising means for receiving the sequence of symbols from a serial turbo encoder.

23. An apparatus according to claim 14, further comprising means for receiving the sequence of symbols from a transmitter comprising an encoder and a modulator.

24. An apparatus according to claim 14, wherein the apparatus comprises a wireless cellular system.

25. An apparatus according to claim 24, wherein the apparatus comprises a W-CDMA transmitter and a W-CDMA receiver.

* * * * *